(12) United States Patent
John et al.

(10) Patent No.: US 8,982,015 B2
(45) Date of Patent: Mar. 17, 2015

(54) SHIFT REGISTER AND ACTIVE MATRIX DEVICE

(75) Inventors: Gareth John, Oxford (GB); Patrick Zebedee, Oxford (GB)

(73) Assignee: Sharp Kabushiki Kaisha, Osaka (JP)

( * ) Notice: Subject to any disclaimer, the term of this patent is extended or adjusted under 35 U.S.C. 154(b) by 1219 days.

(21) Appl. No.: 12/736,144

(22) PCT Filed: Mar. 31, 2009

(86) PCT No.: PCT/JP2009/057027
§ 371 (c)(1),
(2), (4) Date: Sep. 15, 2010

(87) PCT Pub. No.: WO2009/130989
PCT Pub. Date: Oct. 29, 2009

(65) Prior Publication Data
US 2011/0007040 A1   Jan. 13, 2011

(30) Foreign Application Priority Data

Apr. 22, 2008  (GB) ................... 0807288.6

(51) Int. Cl.
*G09G 3/20* (2006.01)
*G09G 5/00* (2006.01)
(Continued)

(52) U.S. Cl.
CPC *G11C 19/28* (2013.01); *G09G 3/20* (2013.01); *G09G 3/3674* (2013.01); *G09G 2300/0408* (2013.01); *G09G 2310/0267* (2013.01);
(Continued)

(58) Field of Classification Search
CPC . G09G 3/3266; G09G 3/3611; G09G 3/3648; G09G 3/3674; G09G 3/3677; G09G 2300/0408; G09G 2310/0202; G09G 2310/0267; G09G 2310/0281; G09G 2310/0283; G09G 2310/0286; G11C 19/00; G11C 19/28; G11C 19/285
USPC ........... 345/55, 98–100, 204, 206; 377/64–81
See application file for complete search history.

(56) References Cited

U.S. PATENT DOCUMENTS 5,894,296 A   4/1999  Maekawa
6,377,099 B1  4/2002  Cairns et al.
(Continued)

FOREIGN PATENT DOCUMENTS

JP   53-039845   4/1978
JP   63-034798   2/1988
(Continued)

OTHER PUBLICATIONS

International Search Report.

*Primary Examiner* — Temesgh Ghebretinsae
*Assistant Examiner* — Keith Crawley
(74) *Attorney, Agent, or Firm* — Harness, Dickey & Pierce, P.L.C.

(57) ABSTRACT

A shift register includes cascade-connected stages, each of which includes a data latch and an output stage. In at least one embodiment, the latch has a single data input which, in use, receives a date signal from a preceding or succeeding stage. The output stage includes a first switch, which passes a clock signal to the stage output when the output stage is activated by the latch. The output stage also comprises a second switch, which passes the lower supply voltage to the stage output when the output stage is inactive.

6 Claims, 27 Drawing Sheets

(51) Int. Cl.
*G11C 19/00* (2006.01)
*G11C 19/28* (2006.01)
*G09G 3/36* (2006.01)

(52) U.S. Cl.
CPC .................. *G09G2310/0283* (2013.01); *G09G 2310/0286* (2013.01); *G09G 2340/0492* (2013.01)
USPC ............... 345/55; 345/98; 345/100; 345/206; 377/78

(56) References Cited

U.S. PATENT DOCUMENTS

| | | | |
|---|---|---|---|
| 7,038,653 | B2 | 5/2006 | Moon |
| 7,145,545 | B2 * | 12/2006 | Zebedee et al. ............... 345/100 |
| 2004/0164978 | A1 | 8/2004 | Shin et al. |
| 2004/0234020 | A1 | 11/2004 | Yu |
| 2005/0017065 | A1 | 1/2005 | Onda et al. |
| 2005/0206637 | A1 | 9/2005 | Takahashi et al. |
| 2005/0220262 | A1 | 10/2005 | Moon |
| 2005/0220263 | A1 | 10/2005 | Moon |
| 2005/0264505 | A1 | 12/2005 | Kim |
| 2005/0285840 | A1 * | 12/2005 | Jang et al. ..................... 345/100 |
| 2006/0038766 | A1 | 2/2006 | Morita |
| 2006/0171501 | A1 | 8/2006 | Lim |
| 2007/0091014 | A1 * | 4/2007 | Yamashita et al. ............. 345/55 |
| 2007/0171179 | A1 | 7/2007 | Morosawa |
| 2007/0263763 | A1 | 11/2007 | Moon |
| 2009/0115716 | A1 * | 5/2009 | Murakami et al. ............ 345/100 |
| 2009/0121998 | A1 | 5/2009 | Ohkawa et al. |
| 2009/0267924 | A1 * | 10/2009 | Shimizu et al. ............... 345/204 |
| 2010/0134476 | A1 | 6/2010 | Zebedee et al. |

FOREIGN PATENT DOCUMENTS

| | | |
|---|---|---|
| JP | 2000-236234 | 8/2000 |
| JP | 2005-228459 | 8/2005 |
| JP | 2005-293817 | 10/2005 |
| JP | 2006-058770 | 3/2006 |
| JP | 2006-098764 | 4/2006 |
| JP | 2006-202355 | 8/2006 |
| WO | WO2007/108177 | 9/2007 |
| WO | WO2009/028716 | 3/2009 |

* cited by examiner

F I G. 1 6
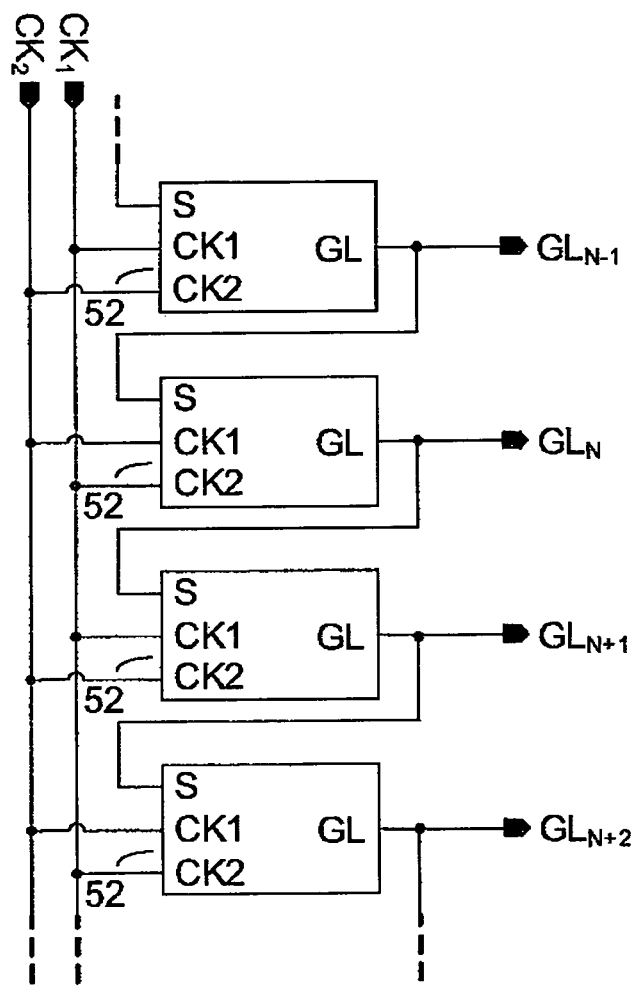

F I G. 2 1
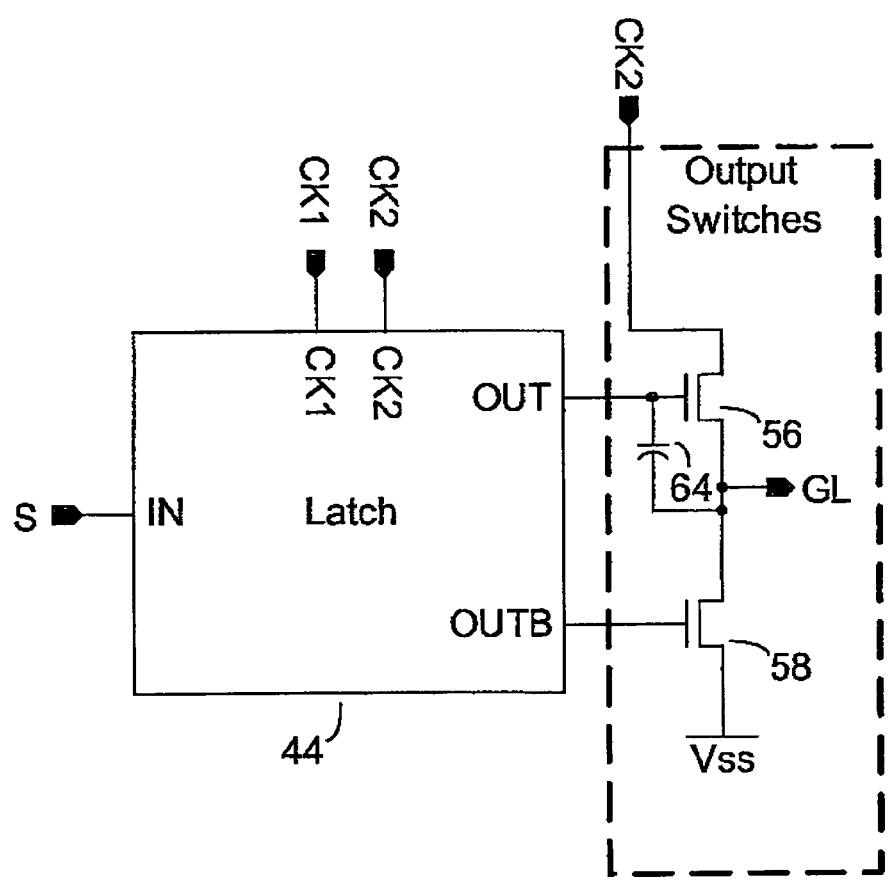

F I G. 2 3
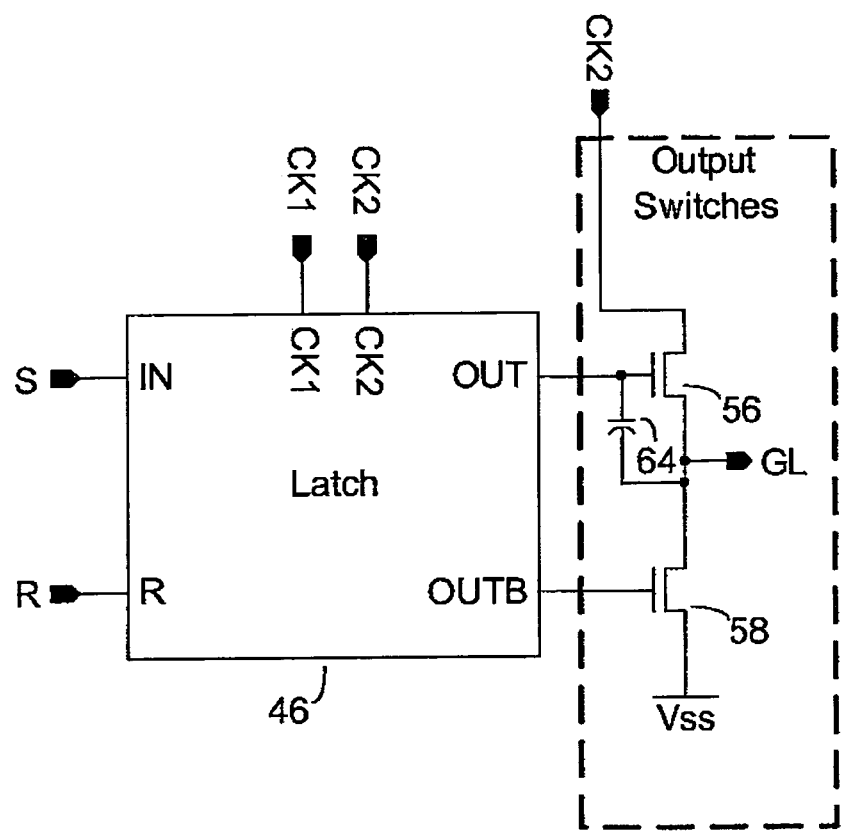

F I G. 2 8
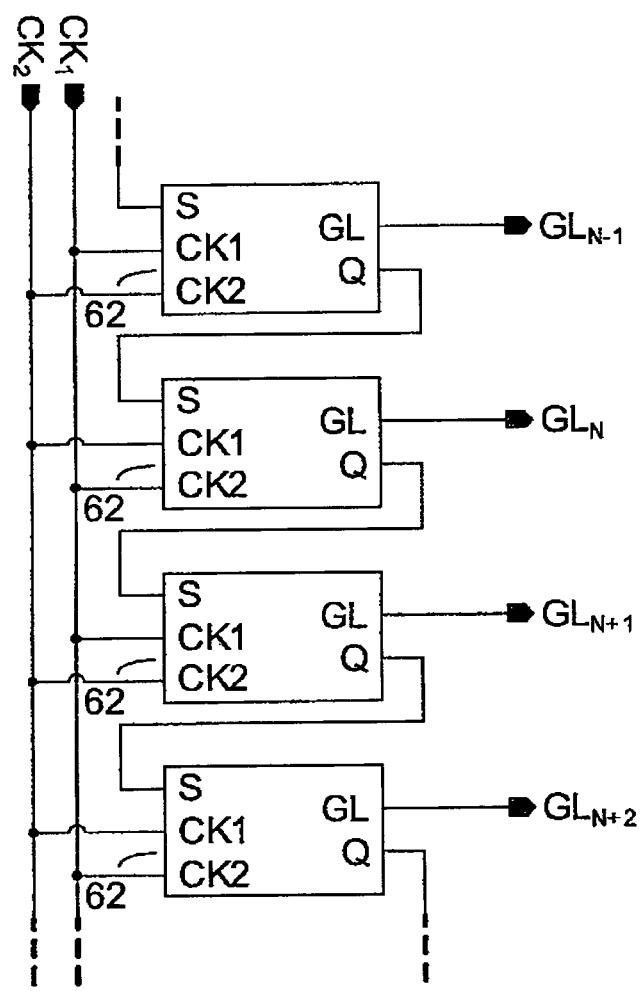

F I G. 2 9
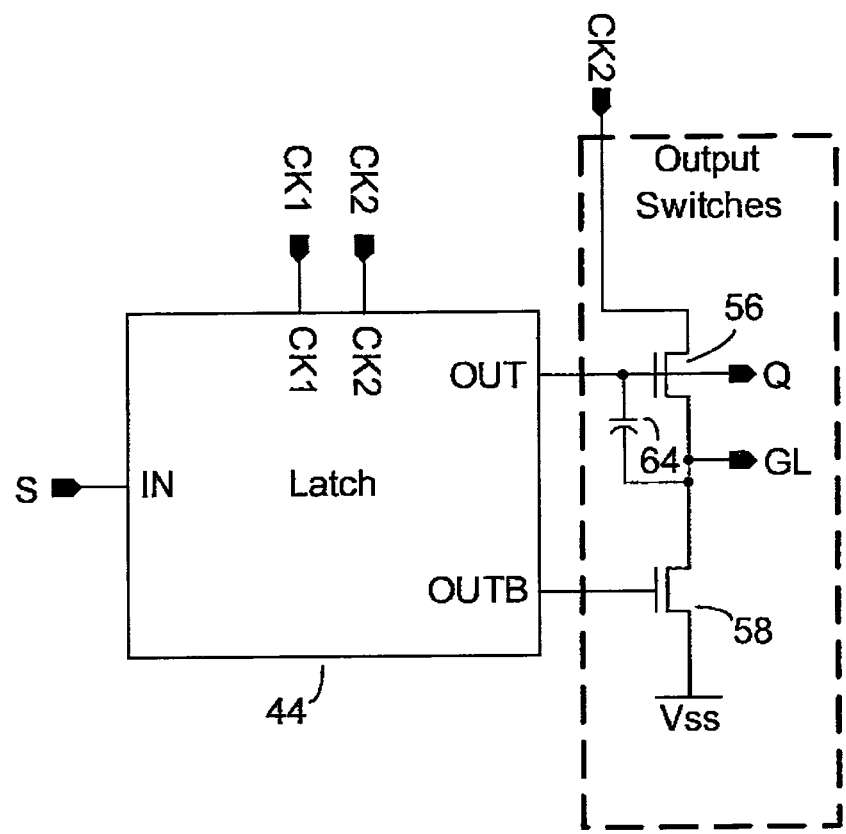

SHIFT REGISTER AND ACTIVE MATRIX DEVICE

TECHNICAL FIELD

The present invention relates to a shift register, for example of a type suitable for use as a clock generator to drive the rows and/or columns of an active matrix display. The present invention also relates to an active matrix device including at least one such shift register.

BACKGROUND ART

FIG. 1 of the accompanying drawings shows a typical active matrix display. Such a display is made up of a matrix 2 of picture elements (pixels), arranged in M rows and N columns. Each row and column is connected to an electrode, with the column electrodes being connected to the N outputs of a data driver 4 and the row electrodes being connected to the M outputs of a scan driver 6.

The pixels are addressed one row at a time. The scan driver includes an M-phase clock generator, which produces a series of clock pulses as shown in FIG. 2 of the accompanying drawings. Each clock pulse $OUT_i$ controls the activation of row i for each i such that $1 \leq i \leq M$. It is usual for the pulses to be non-overlapping, such that no two pulses are high at the same time.

All the pixels of one row may be addressed simultaneously, or they may be addressed in B blocks of b pixels, where bB=N. In the latter case, the data driver may also include a B-phase clock generator of the type described, such that each clock pulse $OUT_1$ activates block i for each i such that $1 \leq i \leq B$.

Scan drivers of the type described may be formed directly on the display substrate, reducing the number of connections required to the display. This is advantageous, since it reduces the area occupied by the connector, and leads to a display which is more mechanically robust. In such cases, it is common to use a single type of transistor for the clock generator circuit ('single-channel'). For example, the circuit may be composed of only n-type transistors, rather than a mixture of n- and p-type transistors, as commonly used in CMOS circuits. The use of a single type of transistor is advantageous for manufacturing cost. However, it is difficult to design low-power, high-speed logic, such as AND gates and inverters, using a single type of transistor.

A clock generator for use in a scan driver may be formed from a shift register. A shift register is a multi-stage circuit capable of sequentially shifting a sequence of data from stage to stage along its length in response to a clock signal. In general, a shift register may shift an arbitrary sequence of data. However, when a shift register is used as a clock generator in a scan or data driver, it is only required to shift a single high state along its length. Such a shift register is referred to as a "walking one" shift register, and may or may not be capable of shifting an arbitrary sequence of data.

An example of such a type of clock generator is disclosed in U.S. Pat. No. 6,377,099, and is shown in FIG. 3 of the accompanying drawings. In this case, the flip-flop 24 is of the reset-set type (RSFF), with an additional gate 26 to control the passage of the clock, such that the clock is passed to the output of the stage when the RSFF is set, and the output is pulled to an inactive state when the RSFF is reset. The output of the gate is connected to the set input of the next stage, and to the reset input of the previous stage. The output of the gate also forms an output of the scan driver.

FIG. 4 of the accompanying drawings illustrates the operation of the clock generator of FIG. 3. The clock signals, CK1 and CK2, are non-overlapping. $Q_N$ represents the Q output of the RSFF, 24, of stage N; $OUT_N$ represents the O output of the gate, 26, of stage N, which also forms the output of the scan driver. When stage N is set, $Q_N$ rises to a high logic level, and its gate, 26, passes the clock to the output. When the clock rises, $OUT_N$ rises, and this sets stage N+1 and resets stage N−1, such that $Q_{N+1}$ rises to a high logic level and $Q_{N-1}$ falls to a low logic level. Stage N+1 is configured to pass the complement of the clock to its output, so the output initially remains low. When the clock falls, the output of stage N falls, and the output of stage N+1 rises. This resets stage N, preventing subsequent clock pulses from being passed to its output, and sets stage N+2.

An example of a single-channel scan driver is disclosed in U.S. Pat. No. 7,038,653, as shown in FIGS. 5 and 6 of the accompanying drawings. The scan driver is composed of a number of stages, 32. Each stage has three inputs: R, S and CK. The CK inputs of odd-number stages are connected to a first clock, $CK_1$; the CK inputs of even-number stages are connected to a second clock, $CK_2$.

FIG. 6 shows the composition of two stages, 32, in FIG. 5. The circuit is composed of only n-type transistors. Each shift register stage is composed of a control logic block, 14, and output stage, 15.

FIG. 7 of the accompanying drawings illustrates the operation of the scan driver of FIG. 6. $Q_N$ represents the Q output of the logic block, 14, of stage N; $GOUT_N$ represents the output of the output stage, 15, of stage N, which also forms the output of the scan driver. When stage N is set, $Q_N$ rises to a high logic level, and its output stage, 15, passes the clock to the output. When the clock rises, $GOUT_N$ rises, and this sets stage N+1 and resets stage N−1, such that $Q_{N+1}$ rises to a high logic level and $Q_{N-1}$ falls to a low logic level. Stage N+1 is configured to pass the complement of the clock to its output, so the output initially remains low. When the clock falls, the output of stage N falls, and the output of stage N+1 rises. This resets stage N, preventing subsequent clock pulses from being passed to its output, and sets stage N+2.

The output stage used is common in such circuits: it is composed of two transistors, 10 and 12, and a bootstrap capacitor, 13. The transistors are controlled by the logic, such that exactly one transistor is activated at any time. The first transistor, 10, passes the clock directly to the output, with no additional logic or buffering; the second, 12, pulls the output to a low supply voltage.

The voltage at the source of an n-type transistor is normally no higher than $V_G-V_{TH}$, where $V_G$ is the gate voltage of the transistor and $V_{TH}$ is the threshold of the transistor. The output of the logic, which supplies $V_G$ to the output switches is, in turn, no higher that Von, the high supply voltage, and is commonly no higher than $V_{ON}-V_{TH}$, for similar reasons (it is generated by a transistor whose gate is no higher than $V_{ON}$). It is preferable to pass the full voltage of the clock to the output (otherwise, it would be necessary to increase the voltage of the clock, which leads to higher power consumption). This requires a gate voltage of at least $V_{CKH}+V_{TH}$, where $V_{CKH}$ is the clock high voltage (commonly equal to $V_{ON}$).

The bootstrap capacitor, 13, acts to increase the gate voltage of the first transistor when the clock rises. Its operation is as follows: the gate of transistor 10 is raised by the logic to a point where it conducts; when the clock rises, the rise is conducted to the output; this rise is coupled to the gate of transistor 10 by the capacitor 13, increasing the gate voltage, and ensuring that transistor 10 continues to conduct until its source and drain voltages are substantially equal.

A common requirement of scan drivers is the capability to control the direction of output pulses; from top to bottom or from bottom to top of the display. A common arrangement allowing bi-directional control is shown in FIG. 8 of the accompanying drawings. This is similar to FIG. 6, and only the differences will be explained. Each R and S input of each stage is connected to a terminal of two transistors; the other terminal of each transistor is connected to the output of the preceding or succeeding stage. In this case, there are four transistors per stage for bi-directional control; stage N is connected to transistors 70-76 in this way. The control terminals of transistors connecting R and S inputs to succeeding and preceding stages respectively are connected to the UD input; the control terminals of transistors connecting R and S inputs to preceding and succeeding stages are connected to the UDB input. UDB is the complement of UD. When UD is active, output pulses traverse the display from stage 1 to stage M; when UD is inactive, output pulses traverse the display from stage M to stage 1.

Another type of single-channel scan driver is disclosed in US patent application publication 2007/0091014, and is shown in FIG. 9 of the accompanying drawings. Each stage is composed of a latch, 34, and output buffer, 36. Each latch has three inputs; IN, CK1 and CK2. The CK1 and CK2 inputs of odd-numbered stages are connected to common $CK_1$ and $CK_2$ signals respectively; the CK1 and CK2 inputs of even-numbered stages are connected to common $CK_2$ and $CK_1$ signals respectively. The output buffer, 36, may be driving a substantial capacitive load. It is difficult to design low power single-channel buffers capable of driving such loads at sufficient speed.

FIG. 10 of the accompanying drawings shows the composition of a latch, 34, in FIG. 9. The latch is composed of two switches and two inverters, 20 and 22. Node X represents the input of inverter 20. The output Q is the output of inverter 22. FIG. 11 of the accompanying drawings shows a transistor-level composition of the latch; all transistors are n-type. FIG. 12 of the accompanying drawings illustrates the operation of the latch. When the clocks CK1 and CK2 are active and inactive respectively, the latch samples the input, IN, which is passed to the output, OUT. During CK1 turning inactive, OUT is latched by CK2 turning active. When CK1 and CK2 turn active and inactive respectively, the latch once again samples IN.

FIG. 13 of the accompanying drawings illustrates the operation of the scan driver in FIG. 9. The clocks, CK1 and CK2, are complementary. The outputs, $OUT_{N-1}$–$OUT_{N+2}$, represent the outputs of the latches, 34. Odd-numbered latches sample preceding stages when CK1 is active; even-numbered latches sample preceding stages when CK2 is active. When $OUT_{N-1}$ and CK2 are active, latch N samples $OUT_{N-1}$, and $OUT_N$ is active. When CK1 is active, $OUT_N$ is latched, latch N+1 samples $OUT_N$, and $OUT_{N+1}$ is active. The scan driver outputs are overlapping and unsuitable for driving the rows of a display. The outputs still overlap when the clocks are non-overlapping.

Some scan drivers incorporate logic gates at the shift register outputs to generate non-overlapping signals. A common arrangement is shown in FIG. 14 of the accompanying drawings. The output of each stage of the shift register, 28, is connected to an AND gate, 30. The other inputs of the AND gate are connected to the output of the previous stage and a Pulse Width Control (PWC) signal. The output of each AND gate forms one output of the scan driver, GL. The output of the AND gates are therefore active when both shift register outputs and PWC are active, as shown in FIG. 15 of the accompanying drawings. It is difficult to design low-power, high-speed AND gates in single-channel.

DISCLOSURE OF INVENTION

According to a first aspect of the invention, there is provided a shift register comprising a plurality of stages, each of at least some of which comprises a data latch and an output stage, each data latch having a single data input arranged, when the register is in use, to receive a data signal from a single adjacent one of the stages, each output stage comprising a first switch arranged to pass a clock signal to a clock stage output when the output stage is active and a second switch arranged to pass an inactive level supply voltage to the stage output when the stage is inactive.

The at least some stages may comprise all of the stages except an end one thereof.

The first and second switches may comprise first and second transistors, respectively. Each of the first switches may comprise a bootstrap capacitor.

The first switch of each odd-ordered stage may be connected between the stage output and a first clock input and the first switch of each even-ordered stage may be connected between the stage output and a second clock input. The latches of the odd-ordered stages may have sample and latch control inputs connected to the second and first clock inputs, respectively, and the latches of the even-ordered stages may have sample and latch control inputs connected to the first and second clock inputs, respectively. Each latch may comprise: a first inverter, whose input is connected to an input node and whose output is connected to a complementary output of the latch; a second inverter, whose input is connected to the input of the first inverter and whose output is connected to an output of the latch; a third switch connected between an input of the latch and the input node and controlled by the sample control input; and a fourth switch connected between the input node and the output of the second inverter and controlled by the latch control input. The third and fourth switches may comprise third and fourth transistors, respectively.

The first inverter may comprise a fifth transistor whose control electrode is connected to the input node, whose common electrode is connected to a first power supply line, and whose inverting output electrode is connected via a diode-connected sixth transistor to a second power supply line.

The second inverter may comprise a seventh transistor, whose control electrode is connected to the output of the first inverter and whose inverting output electrode is connected to the output of the second inverter, and an eighth transistor, whose control electrode is connected to the input node and whose common electrode is connected to the output of the second inverter.

Each latch may comprise a fifth switch connected between the input node and the inactive level supply voltage and arranged to be controlled by the register reset signal. The fifth switch may comprise a ninth transistor.

Each data input may be arranged to receive the data signal from the output of the output stage of the adjacent stage.

Each data input may be arranged to receive the data signal from the output of the latch of the adjacent stage.

Each data input may be connected via sixth and seventh switches to the adjacent stages for receiving the data signal, the sixth and seventh switches being arranged to be controlled so that all of the stages receive the data signals selectively from the proceeding stages or from the succeeding stages. The sixth and seventh switches may comprise tenth and eleventh transistors, respectively.

All of the transistors may be of a same conduction type.

All of the transistors may be thin film transistors.

According to a second aspect of the invention, there is provided an active matrix device comprising a scan driver and a data driver, at least one of which comprises a register according to the first aspect of the invention.

An example of an embodiment comprises a circuit which is composed of a cascade of serially-connected stages, each stage comprising:

A latch

An output switching means, comprising

A switch to pass a clock signal to the output when the stage is activated

A switch to pass an inactive supply voltage to the output when the stage is deactivated.

It is thus possible to provide a shift register which is capable of providing non-overlapping output signals. Such a register may be made by a single channel process, for example on a substrate of an active matrix device. No stage-resetting signal is required from an adjacent stage so that, for example in the case of a bi-directional shift register, fewer components are required for bi-directional control.

BRIEF DESCRIPTION OF DRAWINGS

FIG. 16 is a block schematic diagram of a multiple-stage scan driver constituting an embodiment of the invention;

FIG. 21 is a block schematic diagram of one of the stages of FIG. 16;

FIG. 23 is a block schematic diagram of one of the stages of FIG. 22, constituting another embodiment of the invention;

FIG. 28 is a block schematic diagram of a multiple-stage scan driver constituting another embodiment of the invention; and FIG. 29 is a block schematic diagram of one of the stages of FIG. 28.

BEST MODE FOR CARRYING OUT THE INVENTION

A first embodiment is shown in FIG. 16. The scan (or data) driver is composed of a number of stages, 52. The stages are arranged as even-numbered stages, such as stages N and N+2, and odd-numbered stages, such as stages N−1 and N+1. Each stage has three inputs; S, CK1 and CK2. The CK1 and CK2 inputs of odd-numbered stages are connected to common $CK_1$ and $CK_2$ signals respectively; the CK1 and CK2 inputs of even-numbered stages are connected to common $CK_2$ and $CK_1$ signals respectively. The clocks are preferably non-overlapping, such that the scan driver outputs are non-overlapping. However, the clocks may also be complementary, such that the scan driver outputs have coincident edges.

Each stage has an output GL. The GL output of each stage forms an output of the driver, $GL_N$, and is connected to the S input of the succeeding stage (except for an end one of the stages).

Figure 17:
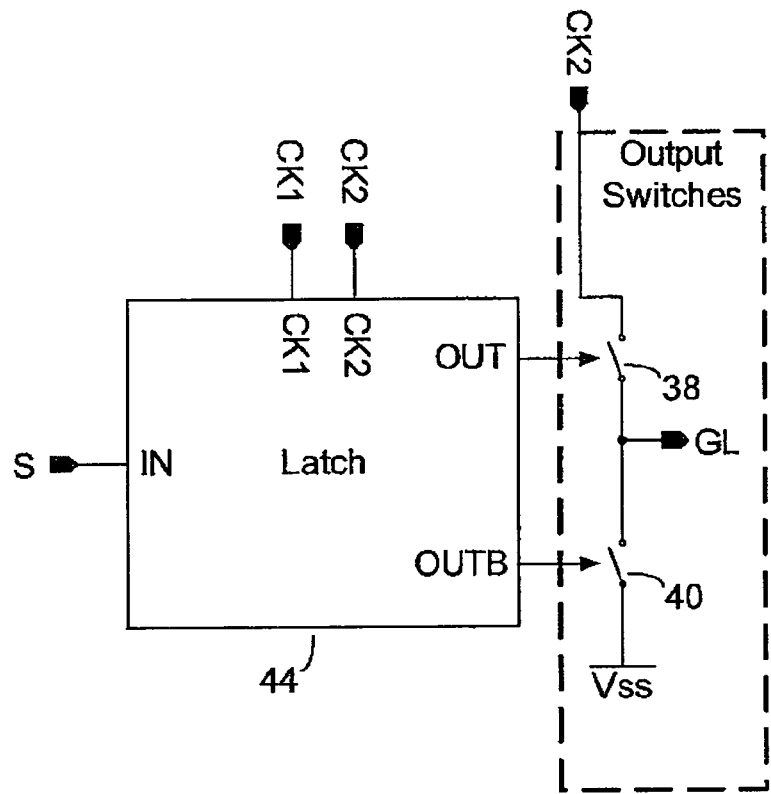
FIG. 17 is a block schematic diagram of one of the stages of FIG. 16.

FIG. 17 shows the composition of one stage, 52, of FIG. 16. Each stage is composed of a latch, 44, and two switches, 38-40. The latch has one input, which is connected to the S input of the stage, and two outputs, OUT and OUTB. The OUTS output is the complement of OUT.

The OUT output of the latch is connected to the control terminal of switch 38 in FIG. 17; the OUTB output is connected to the control terminal of switch 40. Switch 38 is connected such that its principal conduction path is between the CK2 input and the GL output; switch 40 is connected such that its principal conduction path is between the GL output and a low supply voltage Vss.

Figure 10:
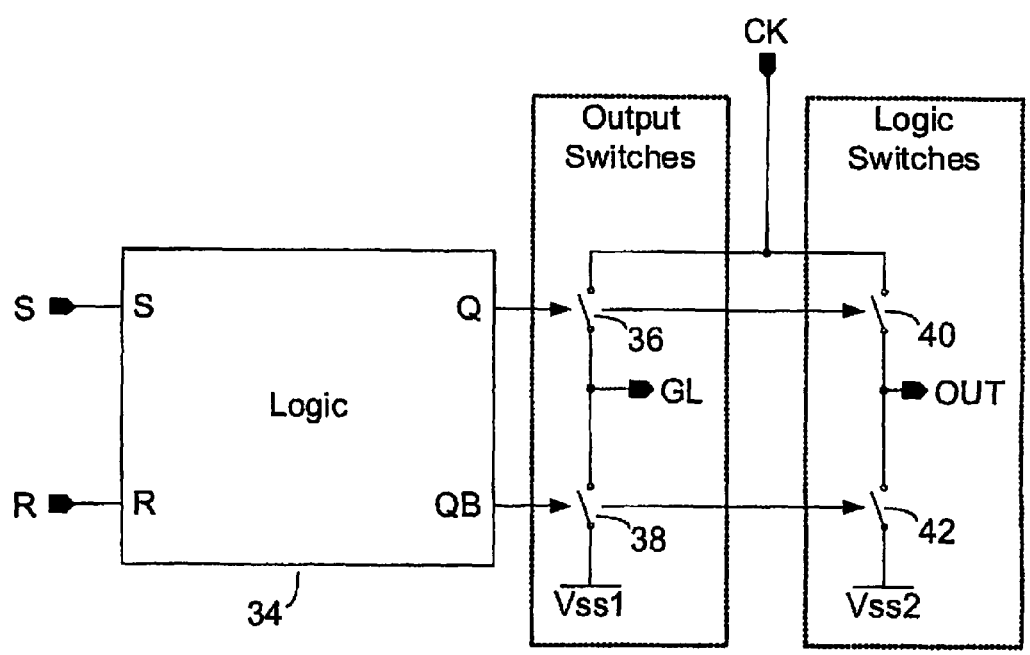
FIGS. 10 and 11 are schematic diagrams of the latch in FIG. 9.
Figure 18:
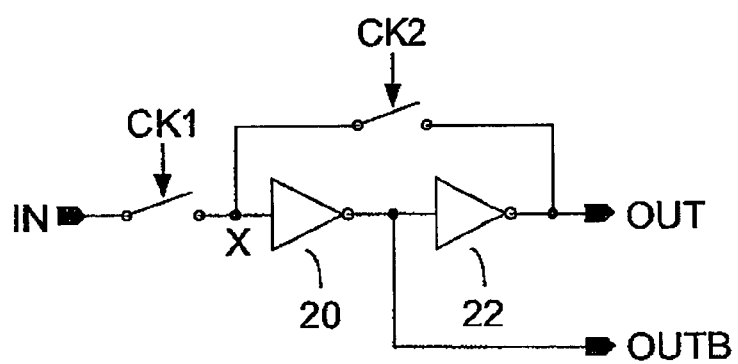
FIGS. 18 and 19 are schematic diagrams of the latch of FIG. 17.

FIG. 18 shows an embodiment of the latch, 44, of FIG. 17. The latch has sample and latch inputs (CK1 and CK2) controlling the respective switches. The latch is similar to that of FIG. 10 and only the differences will be explained. The output OUTB is the output of inverter 20.

Figure 11:
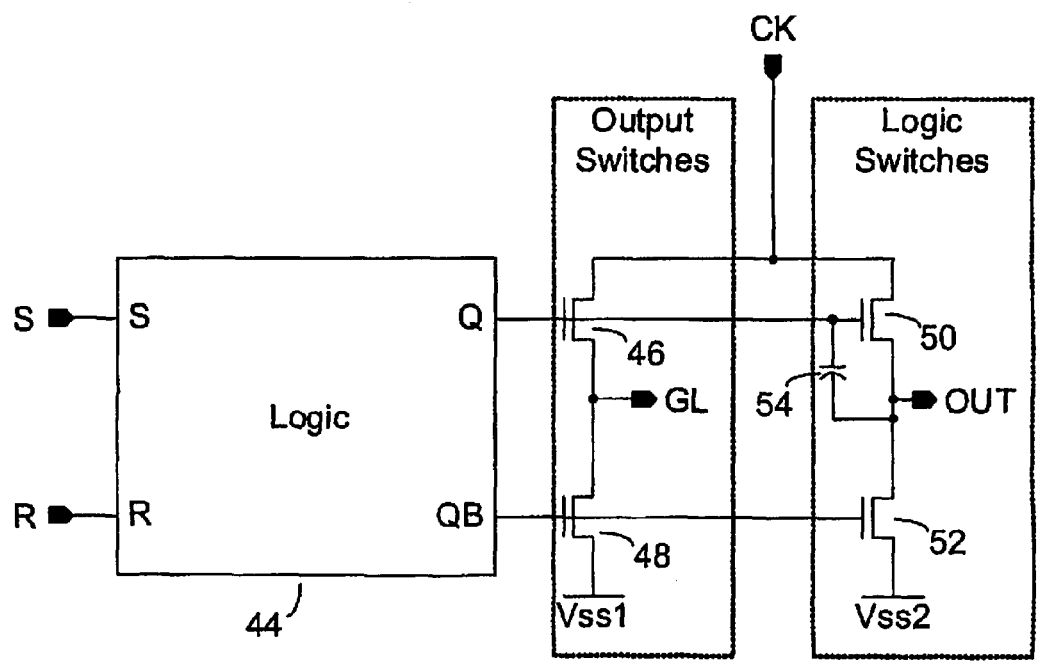
Figure 12:
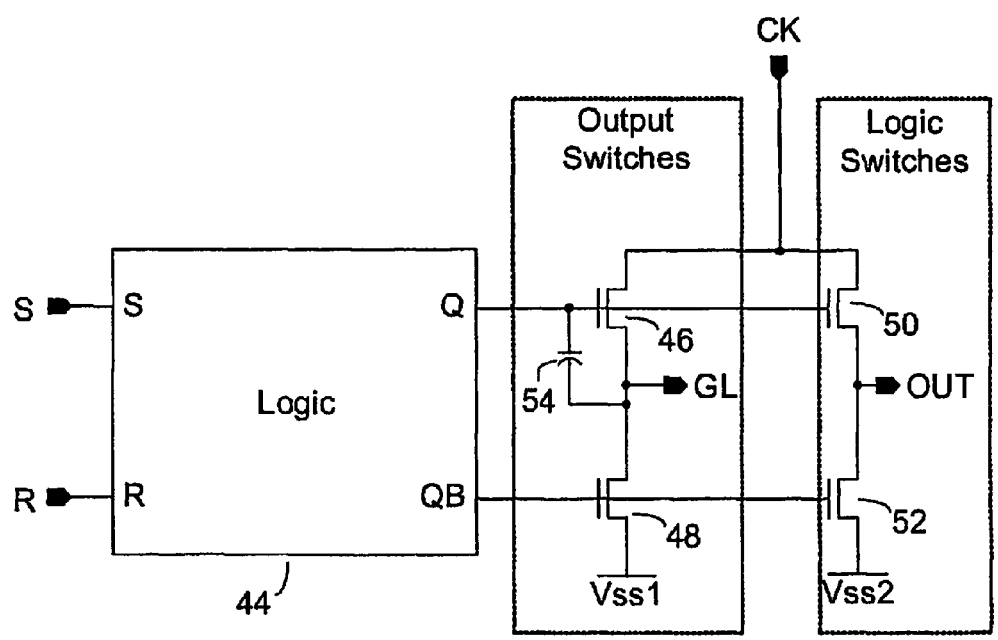
FIG. 12 is a waveform diagram illustrating the operation of the latch in FIG. 11.
Figure 13:
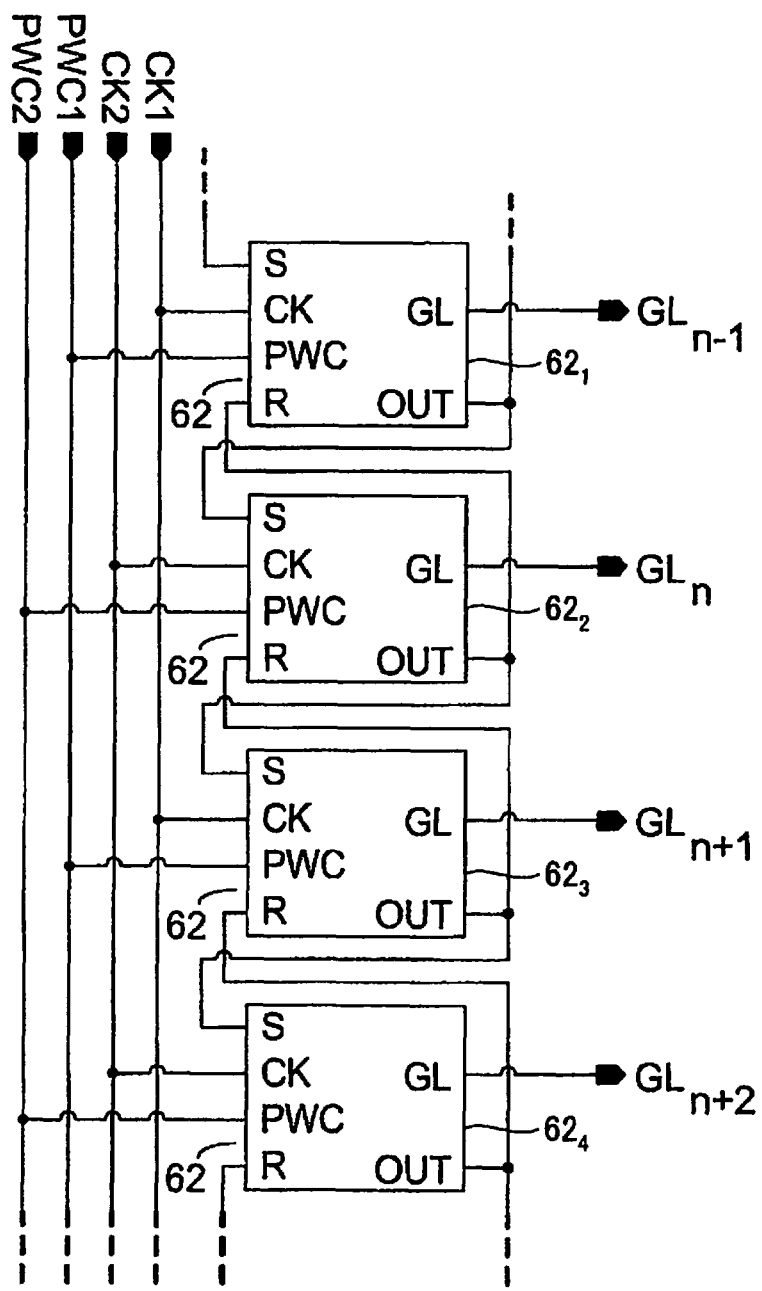
FIG. 13 is a waveform diagram illustrating the operation of the scan driver of FIG. 9.
Figure 14:
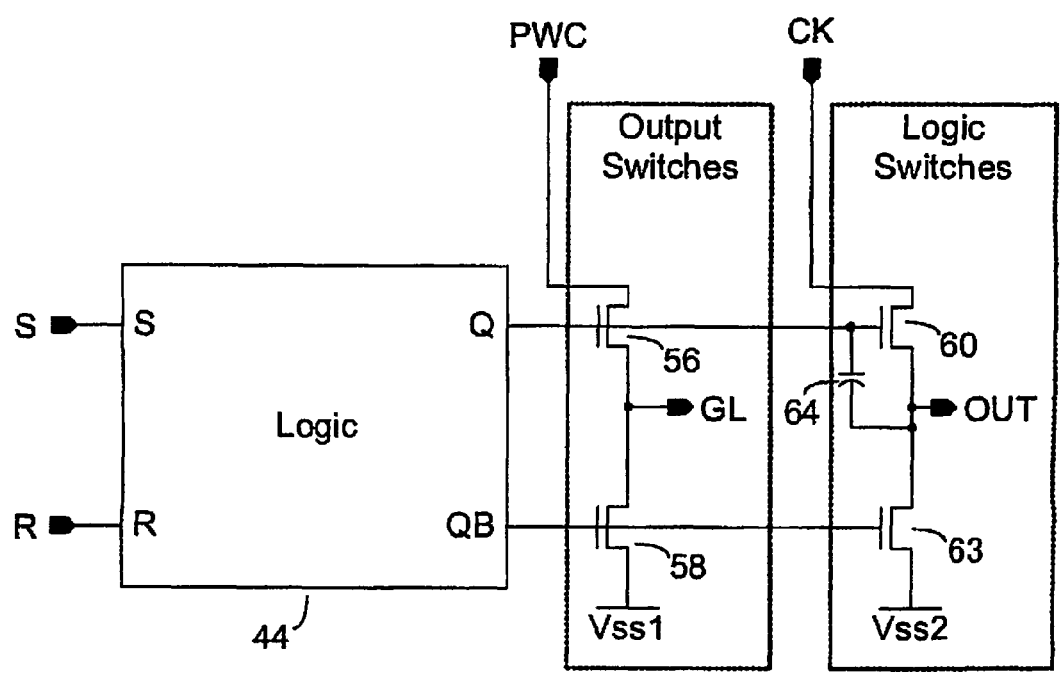
FIG. 14 is a schematic diagram of a known type of scan driver.
Figure 15:
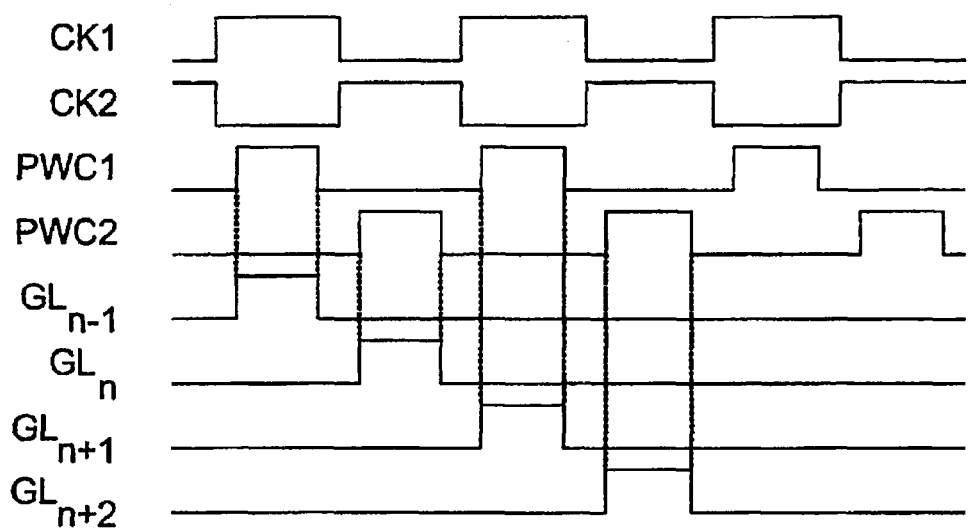
FIG. 15 is a waveform diagram illustrating the operation of the scan driver of FIG. 14.
Figure 19:
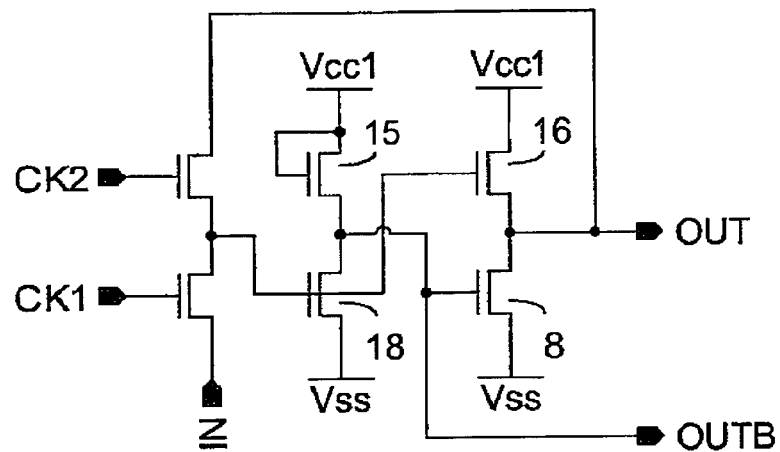

FIG. 19 shows another embodiment of the latch. This is similar to that in FIG. 11, and only the differences will be explained. The control terminal of transistor 15 is connected to the supply voltage Vcc1 so that the transistor 15 is diode-connected. The control terminal of transistor 16 is connected to the control terminal of transistor 18. FIG. 12 illustrates the operation of the latch. When CK1 is active (CK2 inactive), the control terminals of transistors 16 and 18 are connected to the input IN. If IN is active, transistors 16 and 18 are active, pulling OUTB to Vss, deactivating transistor 8, and pulling OUT to Vcc1. Conversely, if IN is inactive, transistors 16 and 18 are inactive, pushing OUTB to Vcc1, activating transistor 8, and pulling OUT to Vss. In this way, the state of IN is passed to OUT. When CK2 is active (CK1 inactive), the control terminals of transistors 16 and 18 are connected to OUT, and OUT is now latched. When CK1 and CK2 turn active and inactive respectively, the latch once again samples IN.

Another embodiment of the latch uses a resistor in place of transistor 16 in FIG. 19.

Figure 20:
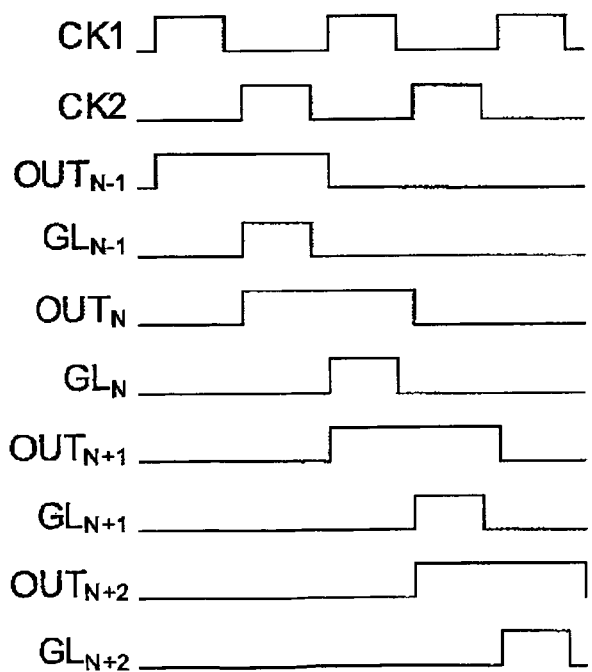
FIG. 20 is a waveform diagram illustrating the operation of the circuits in FIGS. 18 and 19.

FIG. 20 shows the timing for the signals in FIG. 16. Signals $OUT_{N-1}$ to $OUT_{N+2}$ are the outputs of latches in stages N−1 to N+2 respectively. Latches in odd-numbered stages sample the outputs of preceding stages when CK1 is active; latches in even-numbered stages sample when CK2 is active. The outputs of adjacent latches are overlapping, whilst the outputs of adjacent stages are non-overlapping.

FIG. 21 shows a transistor-level embodiment of the stage of FIG. 17. The connections between the stages are as shown in FIG. 16.

The scan driver is composed of transistors of a same conduction type, such an n-type, only. All of the transistors may be thin film transistors. Each stage is composed of a latch, 44, two transistors, 56-58, and one bootstrap capacitor, 64. The latch has one input, IN, connected to the S input of the stage, and two outputs, OUT and OUTB. The OUTB output is the complement of OUT. The latch may be of the form shown in FIG. 10.

The OUT output of the latch is connected to the control terminal of transistor 56; the OUTB output is connected to the control terminal of transistor 58. Transistor 56 is connected such that its principal conduction path is between the CK2 input and the GL output; transistor 58 is connected such that its principal conduction path is between the GL output and a low supply voltage Vss.

The bootstrap capacitor 64 is connected between the GL output and the OUT output of the latch, and serves to ensure the voltage on the control electrode of the transistor 56 is boosted to a level sufficient for the high level of the CK2 input to conduct fully to GL. GL is connected directly to a row of the display; there is no need for an intermediate output buffer.

Figure 22:
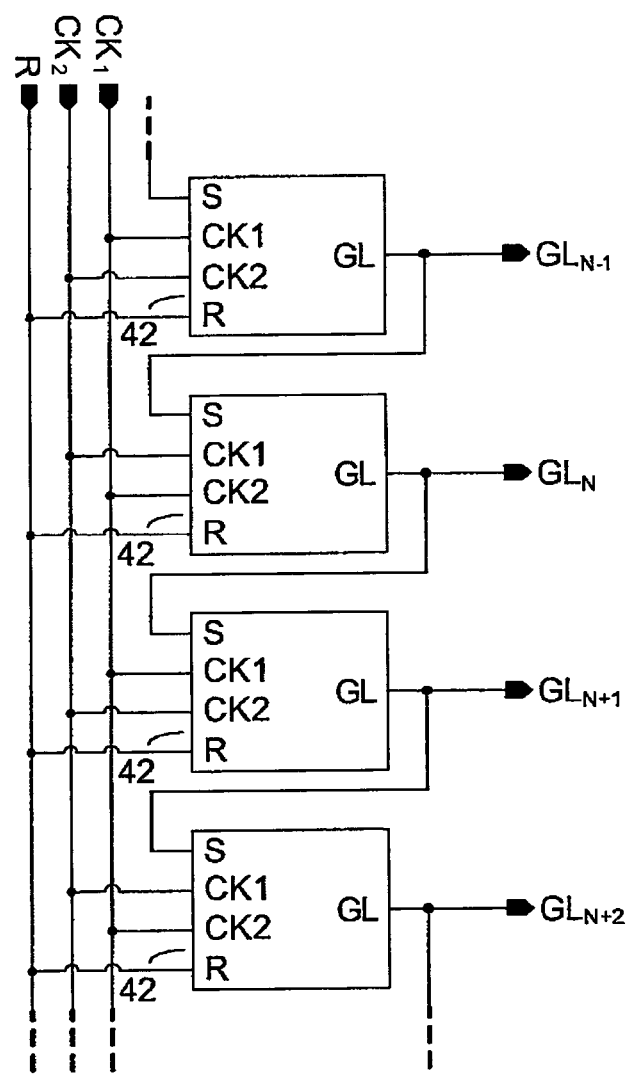
FIG. 22 is a block schematic diagram of a multiple-stage scan driver constituting another embodiment of the invention.

A second embodiment is shown in FIG. 22. A reset input, R, is incorporated into each stage. The R inputs are connected to a common reset signal, R.

FIG. 23 shows the composition of one stage, 42, of FIG. 22. Each stage is similar to that shown in FIG. 21, and only the differences will be described. The latch, 46, has a reset input, R, used to deactivate OUT (OUTB active) and switch the stage output, GL, to a low supply voltage Vss.

Figure 24:
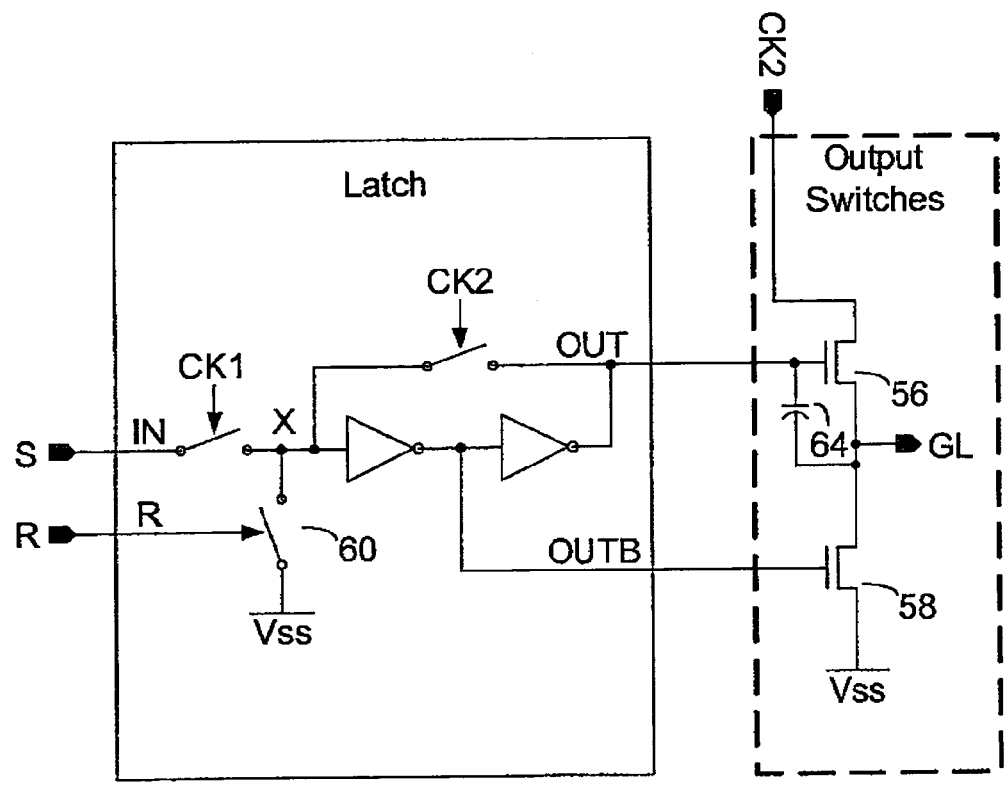
FIG. 24 is a block schematic diagram of one of the stages of FIG. 22, constituting another embodiment of the invention.

FIG. 24 shows an embodiment of the latch in FIG. 23. The latch is similar to that of FIG. 18 and only the differences will be described. The reset input, R, is connected to the control terminal of switch 60. Switch 60 is connected such that its principal conduction path is between node X and a low supply voltage Vss.

Figure 25:
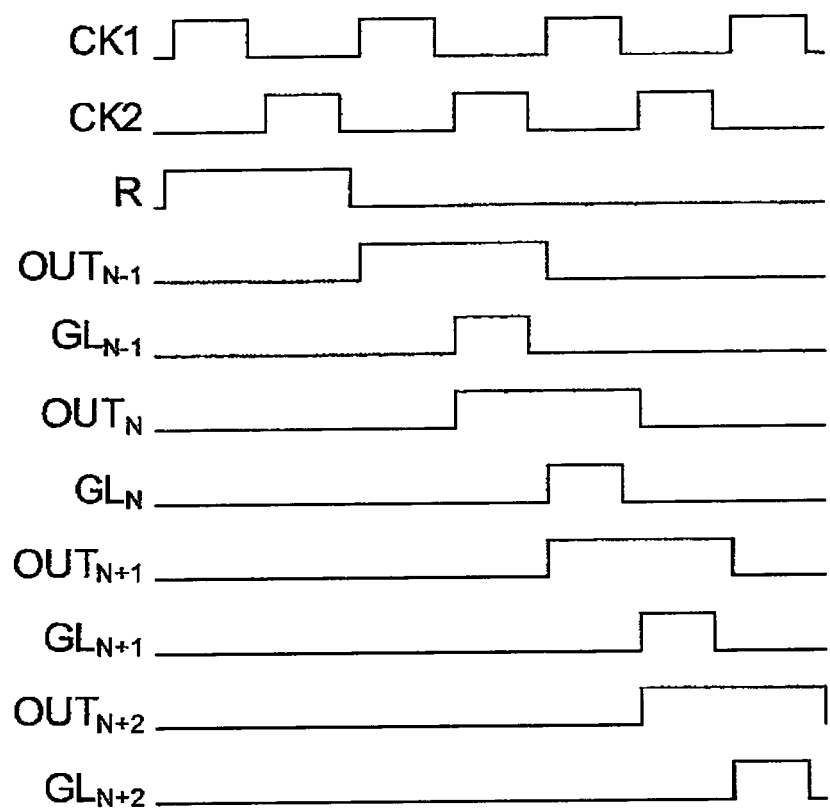
FIG. 25 is a waveform diagram illustrating the operation of the scan driver of FIG. 22.

FIG. 25 shows the timing for signals in FIG. 22. This is similar to that of FIG. 20, and only the differences will be explained. When R is active, typically at the start of operation, node X in FIG. 24 is inactive in all stages, and all driver outputs are inactive.

Figure 1:
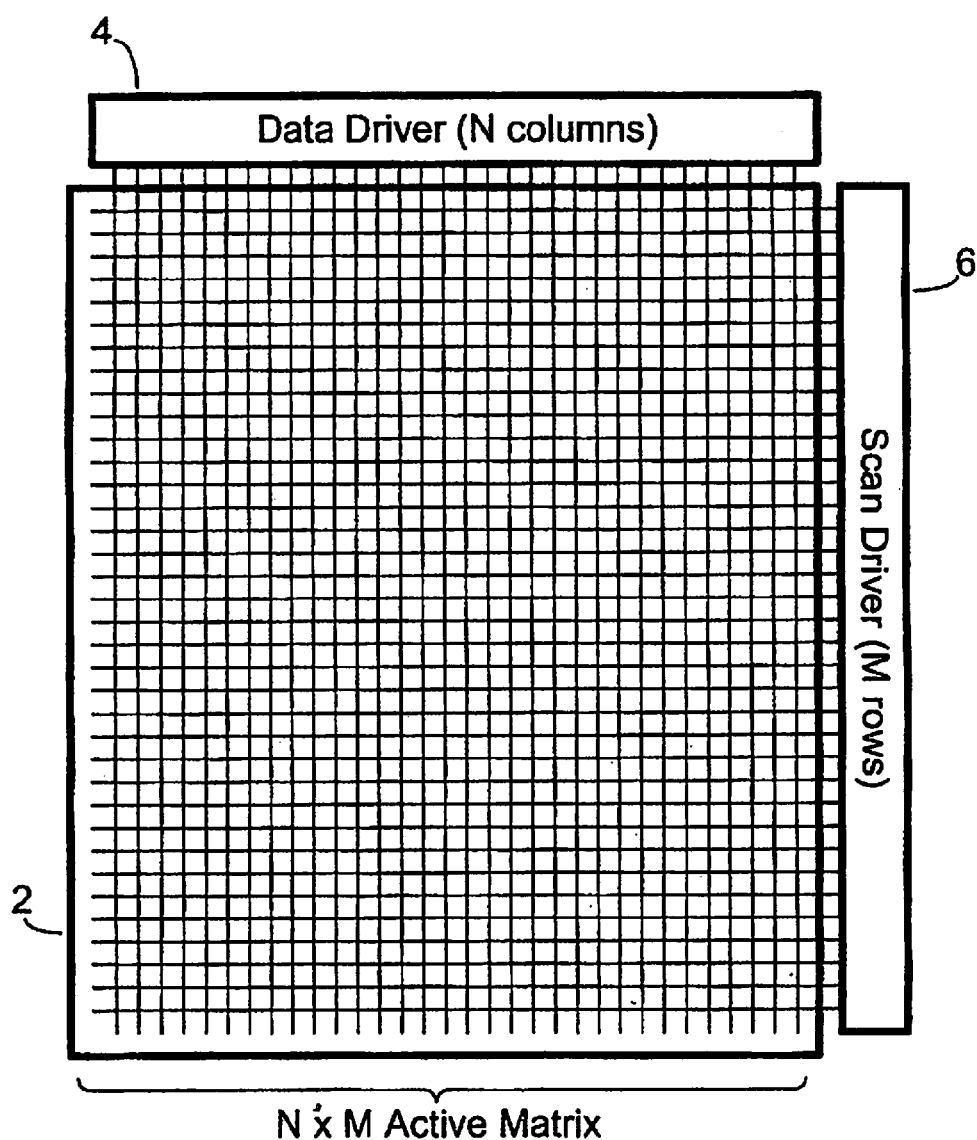
FIG. 1 is a block diagram illustrating a known type of active matrix display.
Figure 2:
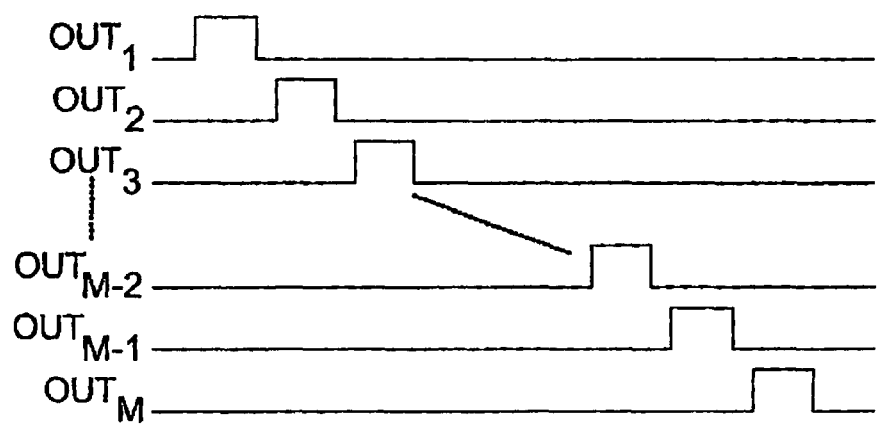
FIG. 2 is a waveform diagram illustrating output pulses of a typical scan driver of the display in FIG. 1.
Figure 3:
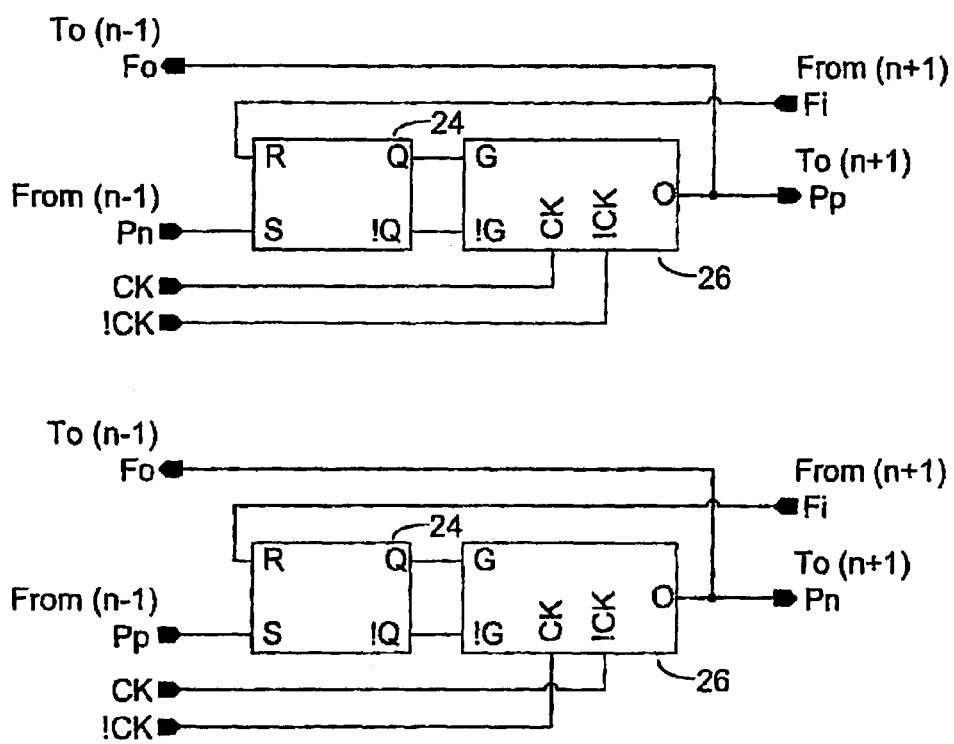
FIG. 3 is a block schematic diagram of a known type of scan driver.
Figure 4:
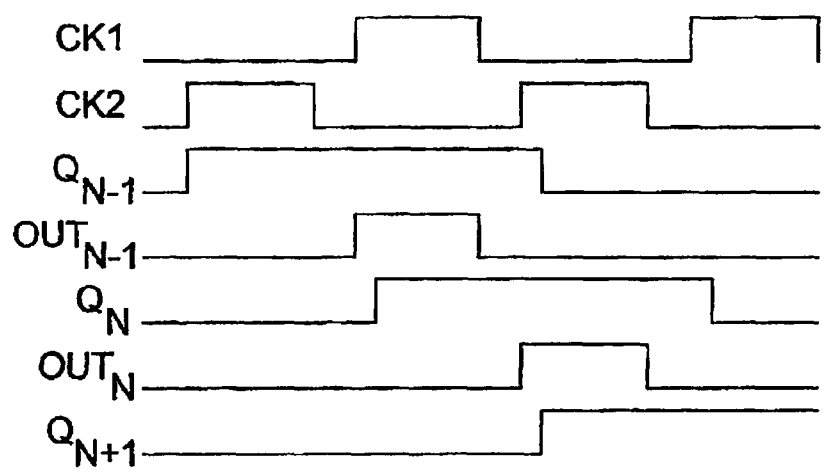
FIG. 4 is a waveform diagram illustrating the operation of the scan driver of FIG. 3.
Figure 5:
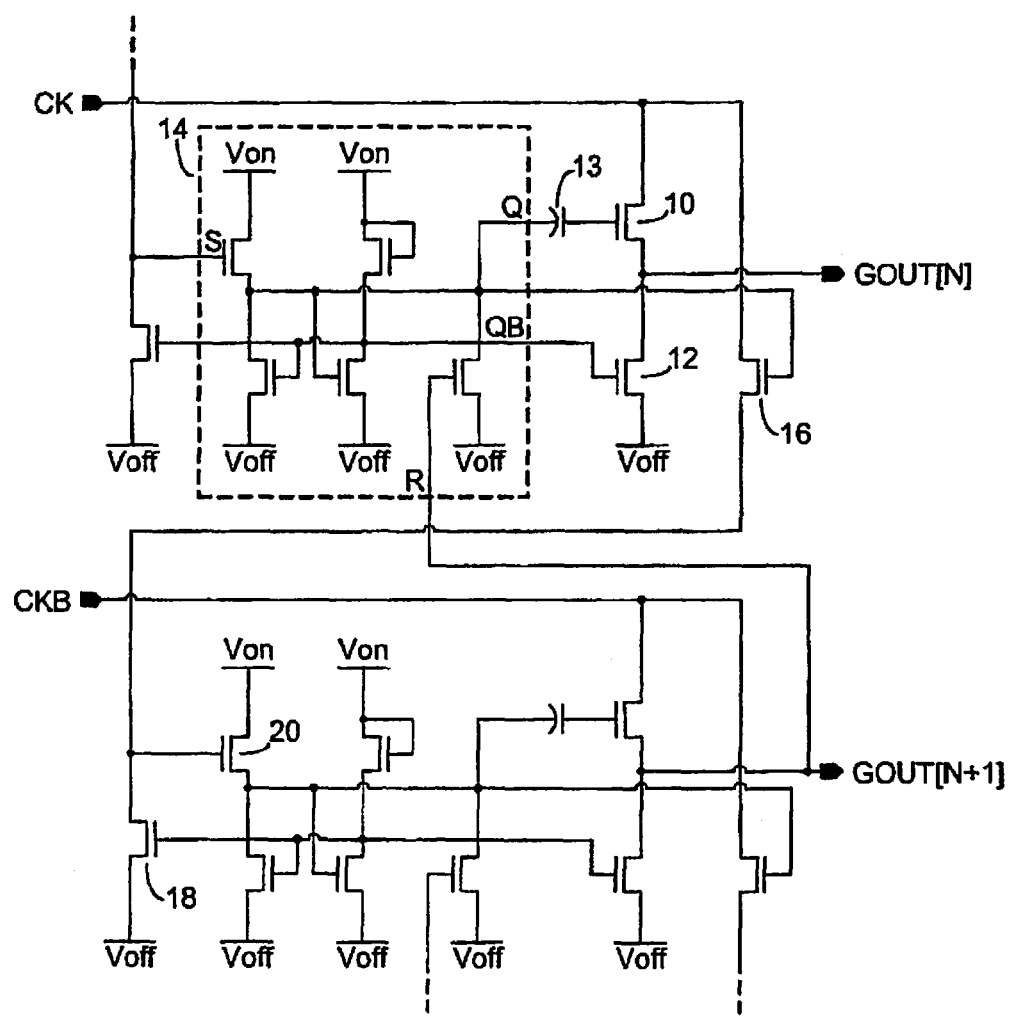
FIGS. 5 and 6 are block schematic diagrams of known types of scan driver.
Figure 6:
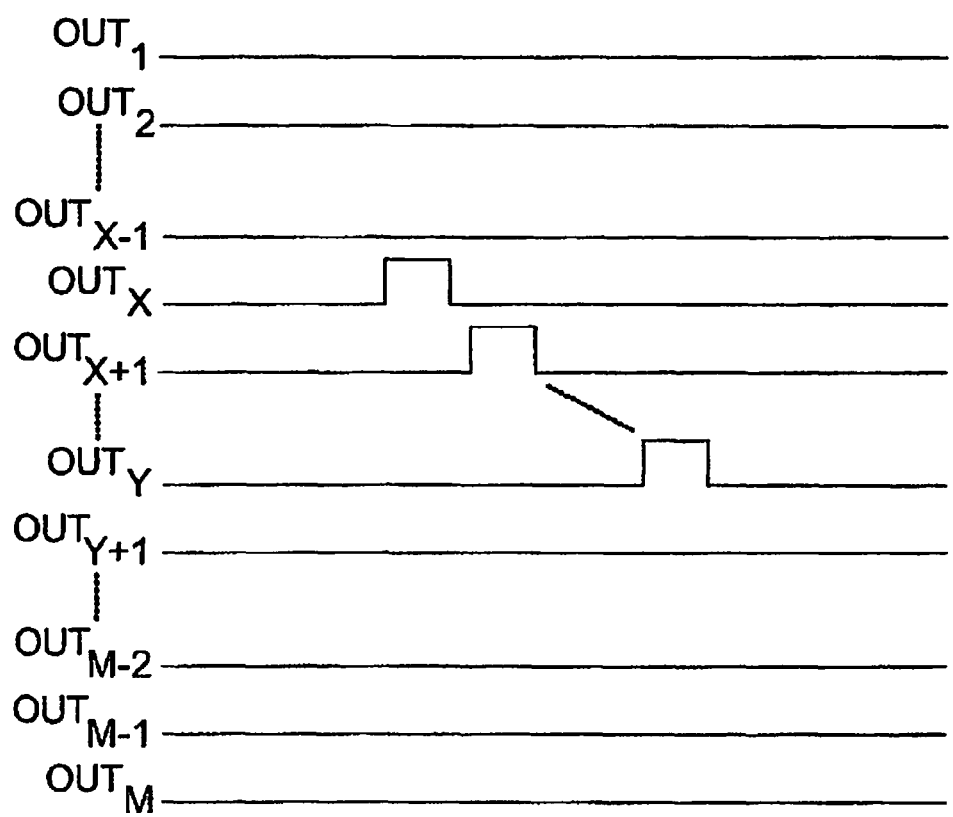
Figure 7:
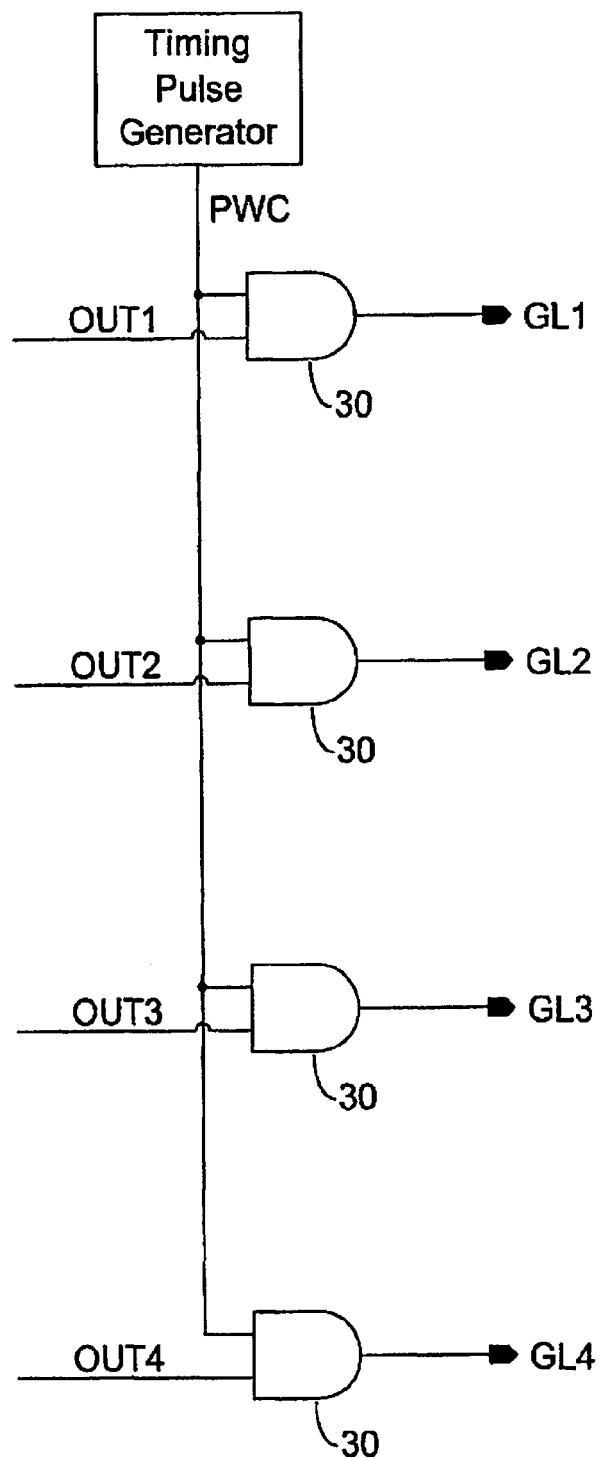
FIG. 7 is a waveform diagram illustrating the operation of the circuit in FIG. 6.
Figure 8:
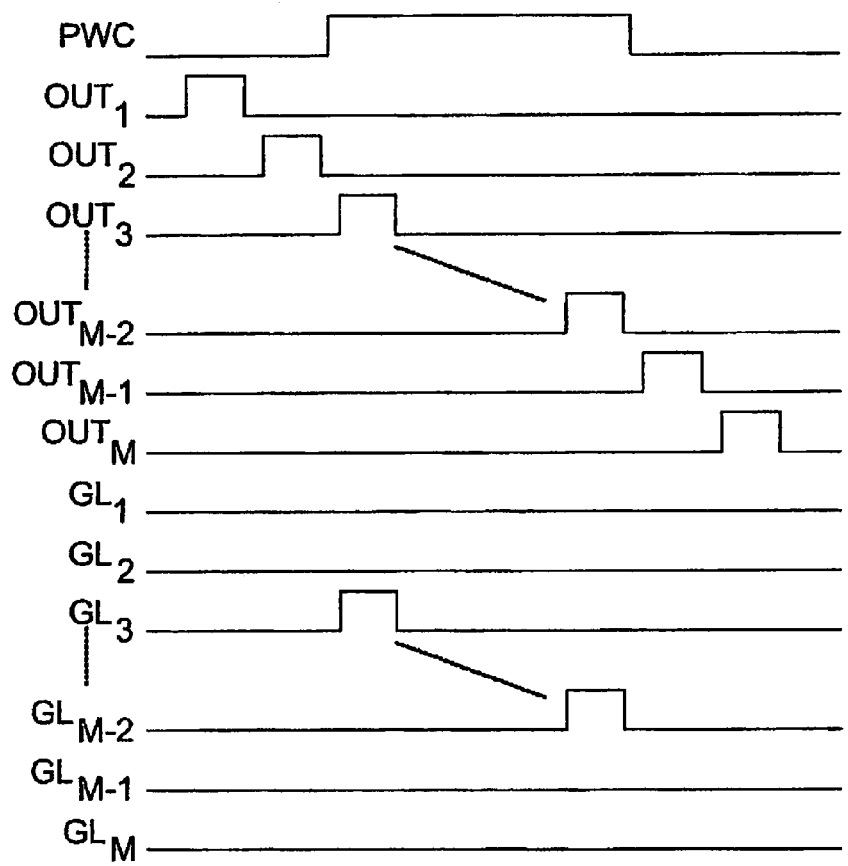
FIGS. 8 and 9 are block schematic diagrams of a known type of scan driver.
Figure 9:
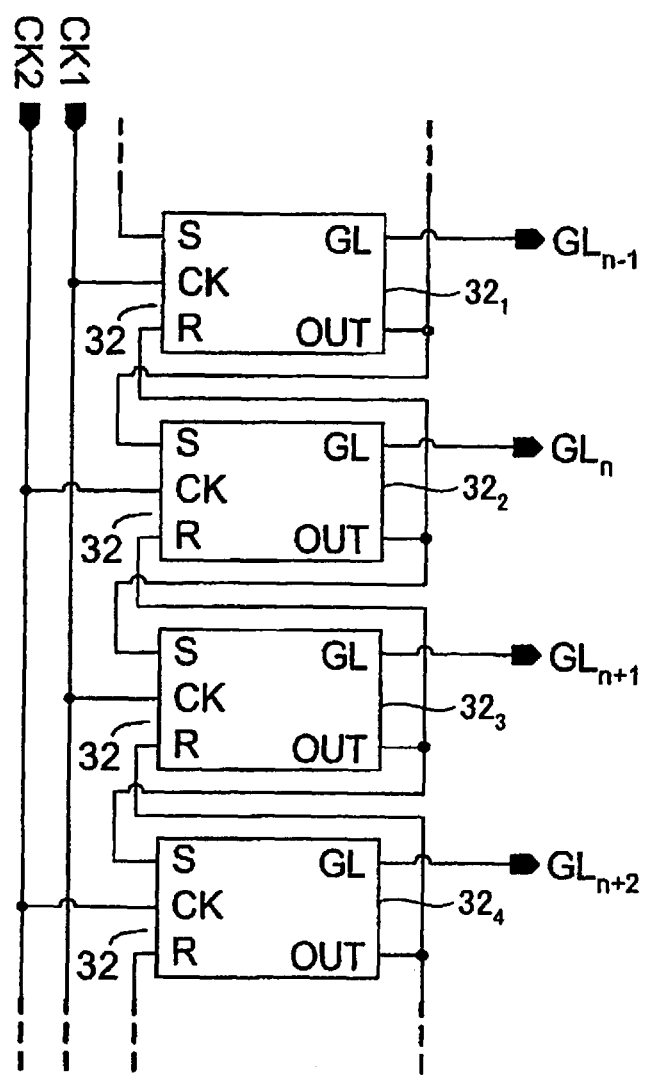
Figure 26:
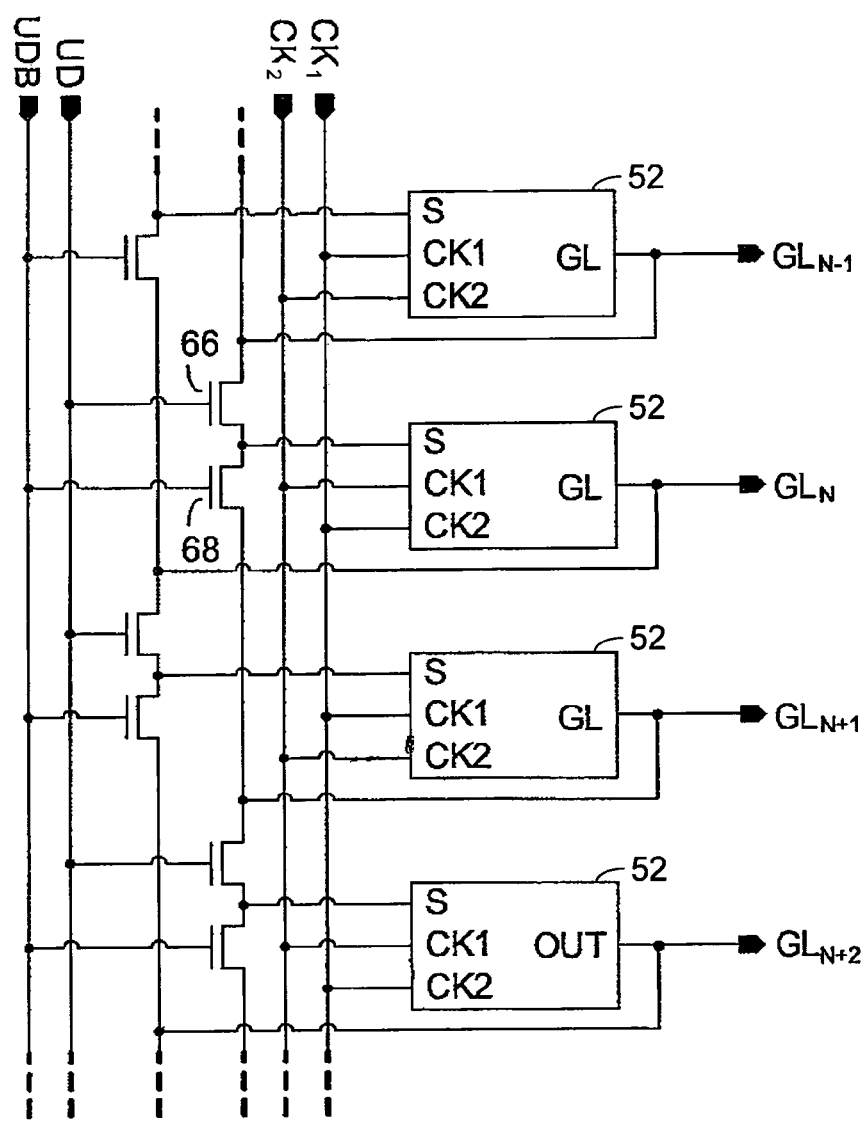
FIG. 26 is a block schematic diagram of a multiple-stage scan driver constituting another embodiment of the invention.

FIG. 26 shows a third embodiment incorporating a bi-directional function to control the direction of output pulses. This is similar to that in FIG. 16, and only the differences will be explained. The S input of each stage is connected to a terminal of two transistors; the other terminal of each transistor is connected to the output of the preceding or succeeding stage. In this case, there are two transistors per stage for bi-directional control; stage N is connected to transistors 66 and 68 in this way. This is advantageous in terms of component count because some scan drivers use four transistors per stage, as shown in FIG. 8. The control terminals of transistors connecting S inputs to preceding stages are connected to the UD input; the control terminals of transistors connected to succeeding stages are connected to the UDB input.

Figure 27:
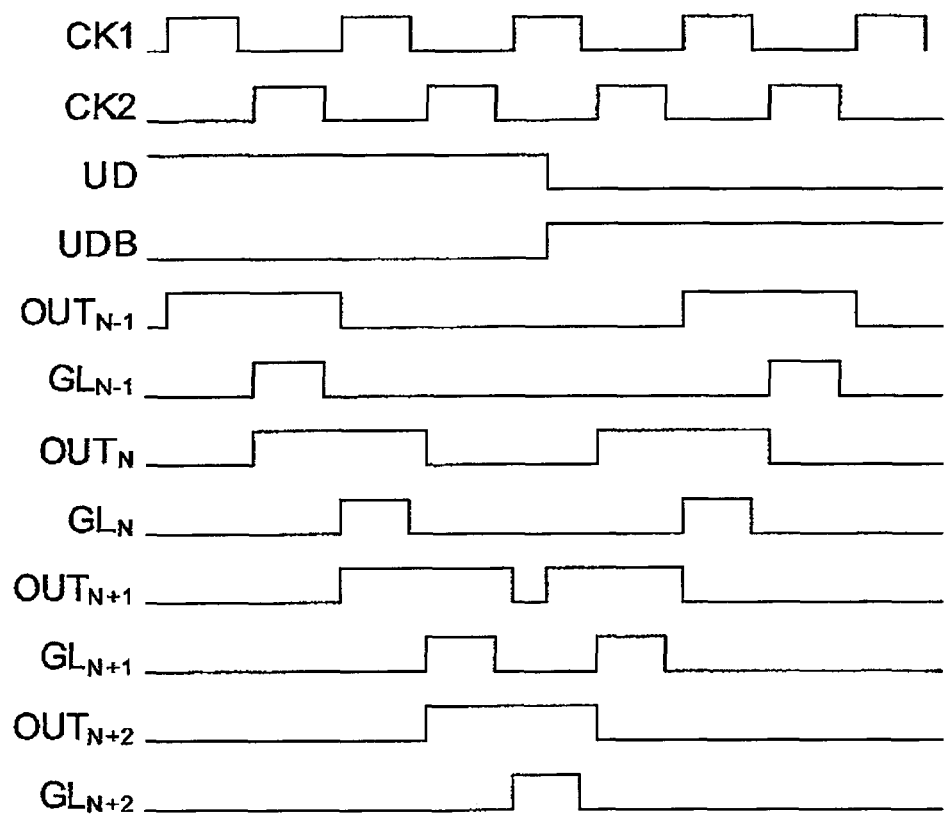
FIG. 27 is a waveform diagram illustrating the operation of the scan driver of FIG. 26.

FIG. 27 shows the timing for signals in FIG. 26. This is similar to that of FIG. 20, and only the differences will be explained. When UD and UDB are active and inactive respectively, each latch samples the output of the previous stage and the shift register output pulses traverse the display from top to bottom, from stage 1 to stage M. When UD and UDB turn inactive and active respectively, stage N+1 samples $GL_{N+2}$ and the output pulses traverse the display from bottom to top, from stage M to stage 1.

A fourth embodiment is shown in FIG. 28. This is similar to that in FIG. 16, and only the differences will be explained. The S input of each stage is connected to the Q output of the preceding stage.

FIG. 29 shows the composition of one stage, 62, of FIG. 28. This is similar to that in FIG. 21, and only the differences will be explained. The stage has an additional output, Q. This is connected to the output of the latch, OUT.

The timing for the signals in FIG. 28 is shown in FIG. 20. Each stage samples the latch output of the preceding stage, Q, not the stage output, GL.

The invention claimed is:

1. A shift register comprising:
   a plurality of stages, each of at least some of the stages including
      a data latch and
      an output stage, each data latch including a single data input arranged, when the shift register is in use, to receive a data signal from a single adjacent one of the stages, and each output stage including
         a first switch arranged to pass a clock signal to a stage output when the output stage is active and
         a second switch arranged to pass an inactive level supply voltage to the stage output when the output stage is inactive,
      wherein the first switch of each odd-ordered stage is connected between the stage output and a first clock input and the first switch of each even-ordered stage is connected between the stage output and a second clock input
      wherein the latches of the odd-ordered stages include sample and latch control inputs connected to the second and first clock inputs, respectively, and the latches of the even-ordered stages have sample and latch control inputs connected to the first and second clock inputs, respectively, and
      wherein each latch includes
         a first inverter, whose input is connected to an input node and whose output is connected to a complementary output of the latch;
         a second inverter, whose input is connected to the output of the first inverter and whose output is connected to an output of the latch;
         a third switch connected between an input of the latch and the input node and controlled by the sample control input; and
         a fourth switch connected between the input node and the output of the second inverter and controlled by the latch control input.

2. A register as claimed in claim 1, in which the third and fourth switches comprise third and fourth transistors, respectively.

3. A register as claimed in claim 1, in which the first inverter comprises a fifth transistor whose control electrode is connected to the input node, whose common electrode is connected to a first power supply line, and whose inverting output electrode is connected via a diode-connected sixth transistor to a second power supply line.

4. A register as claimed in claim 1, in which the second inverter comprises a seventh transistor, whose control electrode is connected to the output of the first inverter and whose inverting output electrode is connected to the output of the second inverter, and an eighth transistor, whose control electrode is connected to the input node and whose common electrode is connected to the output of the second inverter.

5. A register as claimed in claim 1, in which each latch comprises a fifth switch connected between the input node and the inactive level supply voltage and arranged to be controlled by a register reset signal.

6. A register as claimed in claim 5, in which the fifth switch comprises a ninth transistor.

\* \* \* \* \*